United States Patent
Morozumi et al.

(10) Patent No.: US 8,735,304 B2
(45) Date of Patent: May 27, 2014

(54) FILM FORMING METHOD, FILM FORMING APPARATUS, AND STORAGE MEDIUM

(75) Inventors: Yuichiro Morozumi, Nirasaki (JP); Takuya Sugawara, Nirasaki (JP); Koji Akiyama, Nirasaki (JP); Shingo Hishiya, Nirasaki (JP); Toshiyuki Hirota, Tokyo (JP); Takakazu Kiyomura, Tokyo (JP)

(73) Assignees: Elpida Memory Inc., Tokyo (JP); Tokyo Electron Limited, Tokyo (JP)

( * ) Notice: Subject to any disclaimer, the term of this patent is extended or adjusted under 35 U.S.C. 154(b) by 51 days.

(21) Appl. No.: 13/429,742

(22) Filed: Mar. 26, 2012

(65) Prior Publication Data
US 2012/0244721 A1  Sep. 27, 2012

(30) Foreign Application Priority Data
Mar. 25, 2011  (JP) .................................. 2011-68855

(51) Int. Cl.
 *H01L 21/31* (2006.01)
 *H01L 21/469* (2006.01)

(52) U.S. Cl.
 USPC ...... 438/785; 257/E21.24; 700/119; 118/697; 118/724

(58) Field of Classification Search
 None
 See application file for complete search history.

(56) References Cited

U.S. PATENT DOCUMENTS

| | | | | |
|---|---|---|---|---|
| 2004/0214399 | A1* | 10/2004 | Ahn et al. | 438/287 |
| 2007/0001201 | A1* | 1/2007 | Kil et al. | 257/295 |
| 2009/0045485 | A1* | 2/2009 | Hirota | 257/532 |
| 2009/0081385 | A1* | 3/2009 | Heys et al. | 427/585 |
| 2009/0311879 | A1* | 12/2009 | Blasco et al. | 438/785 |
| 2010/0068893 | A1* | 3/2010 | Kato et al. | 438/758 |
| 2010/0308463 | A1* | 12/2010 | Yu et al. | 257/753 |

FOREIGN PATENT DOCUMENTS

| | | |
|---|---|---|
| JP | 2001-152339 A1 | 5/2001 |
| JP | 2006-310754 A1 | 9/2006 |
| WO | 2010082605 A1 | 7/2010 |

* cited by examiner

*Primary Examiner* — Ha Tran T Nguyen
*Assistant Examiner* — Shaka White
(74) *Attorney, Agent, or Firm* — Nath, Goldberg & Meyer; Jerald L. Meyer

(57) ABSTRACT

A method of forming a dielectric film including a zirconium oxide film includes: forming a zirconium oxide film on a substrate to be processed by supplying a zirconium material and an oxidant, the zirconium material including a Zr compound which includes a cyclopentadienyl ring in a structure, and forming a titanium oxide film on the zirconium oxide film by supplying a titanium material and an oxidant, the titanium material including a Ti compound which includes a cyclopentadienyl ring in a structure.

4 Claims, 15 Drawing Sheets

FILM FORMING METHOD, FILM FORMING APPARATUS, AND STORAGE MEDIUM

CROSS-REFERENCE TO RELATED APPLICATION

This application claims the benefit of Japanese Patent Application No. 2011-068855, filed on Mar. 25, 2011, the entire contents of which are incorporated herein by reference.

TECHNICAL FIELD

The present disclosure relates to a film forming method and a film forming apparatus, which form a dielectric film including a zirconium oxide ($ZrO_2$) film, on a substrate to be processed such as a semiconductor wafer, and to a storage medium.

BACKGROUND

Recently, an increasing number of the high-integrating and speeding up of Large Scale Integrated (LSI) circuits is in demand. Thus, the design rules of semiconductor elements configuring the LSI circuits are increasingly miniaturized. Therefore, the number of capacitors used in Dynamic Random Access Memories (DRAMs) increased, and the high permittivity of a dielectric film used in the capacitors also increased.

As a high-permittivity dielectric film used in a capacitor of a DRAM, a zirconium oxide ($ZrO_2$) film is being studied.

As a method of forming the zirconium oxide film, an Atomic Layer Deposition (ALD) process is used. In the ALD process, for example, tetrakis ethylmethylamino zirconium (TEMAZ) is used as feed gas (precursor), $O_3$ gas is used as an oxidant, and the feed gas and the $O_3$ gas are supplied alternately.

However, when separately applying the zirconium oxide film as a dielectric film of a DRAM capacitor, it is difficult to produce both high permittivity and a low leakage current that are necessary for the dielectric films of next generation DRAMs.

To achieve, in the related art, high permittivity and a low leakage current, a capacitor using a two-layer structure is used. Such capacitor includes a $ZrO_2$ film and a metal oxide film (including Ti) such as a $TiO_2$ film, as a dielectric film.

However, the $ZrO_2$ film frequently causes the loss of oxygen. Therefore, even though using the dielectric film having the two-layer structure that includes the $ZrO_2$ film and the metal oxide film (including Ti) such as the $TiO_2$ film as in the above description, it is not easy to achieve the high permittivity and the low leakage current to a desired level.

SUMMARY

The present disclosure provides a film forming method and a film forming apparatus for forming a dielectric film including a zirconium oxide ($ZrO_2$) film, which can achieve both high permittivity and a low leakage current necessary for the dielectric film of a DRAM capacitor.

Further, the present disclosure also provides a storage medium where a program for executing the above film forming method is stored.

According to one embodiment of the present disclosure, a method of forming a dielectric film, including a zirconium oxide film, includes: forming a zirconium oxide film on a substrate to be processed by supplying a zirconium material and an oxidant, the zirconium material including a Zr compound which includes a cyclopentadienyl ring in a structure, and forming a titanium oxide film on the zirconium oxide film by supplying a titanium material and an oxidant, the titanium material including a Ti compound which includes a cyclopentadienyl ring in a structure.

According to another embodiment of the present disclosure, provided is a film forming apparatus for forming a dielectric film including a zirconium oxide film, which includes a processing vessel having a bell shape to maintain vacuum and a tube shape, a maintaining member configured to maintain a plurality of substrates to be processed inside the processing vessel, with the substrates to be processed being maintained in a plurality of stages, a heating apparatus disposed at an outer circumference of the processing vessel, a zirconium material supply instrument configured to supply a zirconium material into the processing vessel, a titanium material supply instrument configured to supply a titanium material into the processing vessel, an oxidant supply instrument configured to supply an oxidant into the processing vessel, and a control instrument configured to control the zirconium material supply instrument, the titanium material supply instrument, and the oxidant supply instrument, wherein the control instrument controls a performance of a process that forms a zirconium oxide film on a substrate to be processed among the substrates to be processed by supplying an oxidant into the processing vessel and simultaneously supplying a Zr compound, including a cyclopentadienyl ring in a structure, as a zirconium material into the processing vessel, and a performance of a process that forms a titanium oxide film on a substrate to be processed among the substrates to be processed by supplying an oxidant into the processing vessel and simultaneously supplying a Ti compound, including a cyclopentadienyl ring in a structure, as a titanium material into the processing vessel.

According to another embodiment of the present disclosure, provided is a storage medium operating in a computer and storing a program for controlling a film forming apparatus, wherein when the program is executed by the computer, the program controls the film forming apparatus to perform the film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings.

<A Film Forming Apparatus Applied to a Film Forming Method According to the Present Disclosure>

Figure 1:
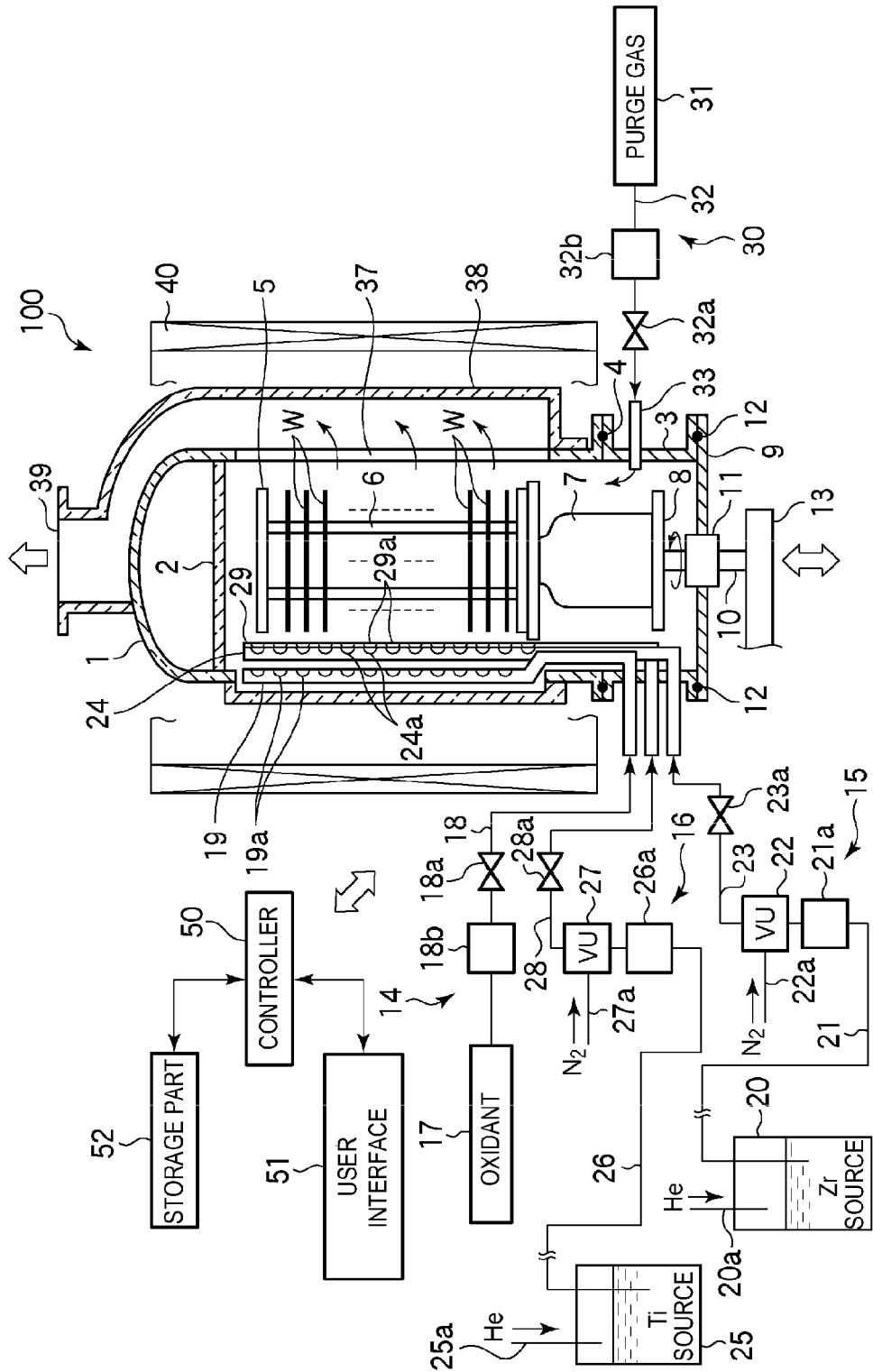
FIG. 1 is a longitudinal sectional view illustrating a film forming apparatus which is applied to a film forming method according to an embodiment of the present disclosure.
Figure 2:
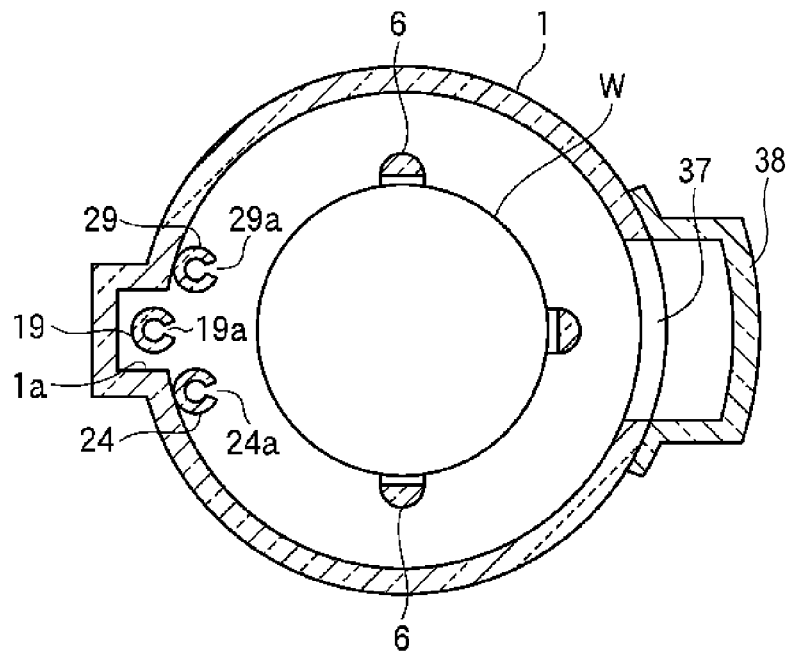
FIG. 2 is a cross-sectional view illustrating the film forming apparatus which is applied to the film forming method according to an embodiment of the present disclosure.

FIG. 1 is a longitudinal sectional view illustrating a film forming apparatus which is applied to a film forming method according to an embodiment of the present disclosure. FIG. 2 is a cross-sectional view illustrating the film forming apparatus of FIG. 1. Also, in FIG. 2, a heating apparatus is not illustrated.

A film forming apparatus 100 includes a cylindrical-shaped processing vessel 1 having a ceiling, of which a lower end portion is opened. The entirety of the processing vessel 1, for example, is formed of quartz, and a ceiling plate 2 of quartz is disposed at the ceiling inside the processing vessel 1 and sealed. Also, for example, a manifold 3 which is formed of stainless steel to have a cylindrical shape is connected to a lower end opening portion of the processing vessel 1 through a seal member 4 such as O-ring.

The manifold 3 supports a lower end portion of the processing vessel 1. A wafer boat 5 of quartz, in which a plurality of semiconductor wafers, for example, 50 to 100 semiconductor wafers (hereinafter, referred to as a wafer simply) W are loaded as objects to be processed in multiple stages, is insertable into the processing vessel 1 through a lower portion of the manifold 3. The wafer boat 5 includes three supporting pillars 6 (see FIG. 2), and the plurality of wafers W are supported by a groove which is formed in each of the supporting pillars 6.

The wafer boat 5 is loaded on a table 8 through a heat insulating tube 7 of quartz. The table 8 is supported on a rotation axis 10 that passes through a cover part 9, which is made of the stainless steel, and opens or closes a lower end opening portion of the manifold 3.

A magnetic fluid seal 11 is disposed at a through portion of the rotation axis 10. The magnetic fluid seal 11 closely seals and rotatably supports the rotation axis 10. Also, for example, a seal member 12 of O-ring is disposed between a peripheral portion of the cover portion 9 and a lower end portion of the manifold 3, thus maintaining sealability in the processing vessel 1.

The rotation axis 10, for example, is disposed at a front end of an arm 13 that is supported by an ascending/descending instrument such as a boat elevator. The rotation axis 10 ascends or descends the wafer boat 5 and the cover part 9 integratedly, and is inserted into or detached from the processing vessel 1. Also, the table 8 may be disposed to be fixed to the cover part 9 side, and the wafer W may be treated without the rotation of the wafer boat 5.

The film forming apparatus 100 includes an oxidant supply instrument 14 that supplies a gaseous oxidant (for example, $O_3$ gas) into the processing vessel 1, a Zr source gas supply instrument 15 that supplies Zr source gas (Zr feed gas) into the processing vessel 1, and a Ti source gas supply instrument 16 that supplies Ti source gas (Ti feed gas) into the processing vessel 1. Also, the film forming apparatus 100 includes a purge gas supply instrument 30 that supplies inert gas (for example, $N_2$ gas) as purge gas into the processing vessel 1.

The oxidant supply instrument 14 includes an oxidant supply source 17, an oxidant pipeline 18 that induces an oxidant from the oxidant supply source 17, and an oxidant dispersion nozzle 19 formed of a quartz pipe. The oxidant dispersion nozzle 19 is connected to the oxidant pipeline 18, and internally passes through a side wall of the manifold 3. Further, the oxidant dispersion nozzle 19 is bent upwardly, and extended vertically. A plurality of gas discharge holes 19a are formed at certain intervals in a vertical portion of the oxidant dispersion nozzle 19, and uniformly discharge oxidants (for example, $O_3$ gas) from each of the gas discharge holes 19a toward the processing vessel 1 in a horizontal direction. In addition to $O_3$ gas, $H_2O$ gas, $O_2$ gas, $NO_2$ gas, NO gas, $N_2O$ gas or the like may be used as an oxidant. A plasma generation instrument may be provided and change an oxidant to plasma, thereby increasing reactivity. Also, radical oxidization using $O_2$ gas and $H_2$ gas may be applied. When using $O_3$ gas, the oxidant supply source 17 may include an ozonizer that generates $O_3$ gas.

The Zr source gas supply instrument 15 includes a Zr source storage vessel 20 that stores a Zr source, which is formed of a Zr compound including a cyclopentadienyl ring in a structure; a Zr source pipeline 21 that induces a liquid Zr source from the Zr source storage vessel 20. The Zr source includes cyclopentadienyl.tris(dimethylamino)zirconium (ZrCp(NMe$_2$)$_3$) ("CPDTMZ"), and methylcyclopentadienyl-.tris(dimethylamino)zirconium (Zr(MeCp)(NMe$_2$)$_3$("MCP-DTMZ"). The Zr source gas supply instrument 15 further includes a vaporizer 22 connected to the Zr source pipeline 21, that vaporizes a Zr source, a Zr source gas pipeline 23 that induces Zr source gas generated by the vaporizer 22, and a Zr source gas dispersion nozzle 24, which is formed of a quartz pipe and connected to the Zr source gas pipeline 23. The Zr source gas dispersion nozzle 24 passes through a side wall of the manifold 3 internally, is bent upwardly, and is extended vertically. A carrier gas pipeline 22a, which supplies $N_2$ gas as carrier gas, is connected to the vaporizer 22. A plurality of gas discharge holes 24a are formed at certain intervals along the length direction of the Zr source gas dispersion nozzle 24, in the Zr source gas dispersion nozzle 24, and uniformly discharge Zr source gas from each of the gas discharge holes 24a into the processing vessel 1 in a horizontal direction.

The Ti source gas supply instrument 16 includes a Ti source storage vessel 25 that stores a Ti source, which is formed of a Ti compound including a cyclopentadienyl ring in a structure. The Ti source may be methylcyclopentadienyl.tris(dimethylamino)titanium (Ti(MeCp)(NMe$_2$)$_3$) ("MCPDTMZ"). The Ti source gas supply instrument 16 further includes a Ti source pipeline 26 that induces a liquid Ti source from the Ti source storage vessel 25, a vaporizer 27 connected to the Ti source pipeline 26 that vaporizes a Ti source, a Ti source gas pipeline 28 that induces Ti source gas generated by the vaporizer 27; and a Ti source gas dispersion nozzle 29, formed of a quartz pipe, which is connected to the Ti source gas pipeline 28, passes through a side wall of the manifold 3 internally, is bent upwardly, and is extended vertically. A carrier gas pipeline 27a, which supplies $N_2$ gas as carrier gas, is connected to the vaporizer 27. A plurality of gas discharge holes 29a are formed at certain intervals along the length direction of the Ti source gas dispersion nozzle 29, in the Ti source gas dispersion nozzle 29, and uniformly discharge Ti source gas from each of the gas discharge holes 29a into the processing vessel 1 in a horizontal direction.

Moreover, the purge gas supply instrument 30 includes a purge gas supply source 31, a purge gas pipeline 32 that induces purge gas from the purge gas supply source 31, and a purge gas nozzle 33 connected to the purge gas pipeline 32, which is disposed to pass through a side wall of the manifold 3. Inert gas, for example, $N_2$ gas may be appropriately used as purge gas.

An opening/closing valve 18a and a flux controller 18b such as a mass flow controller are disposed in the oxidant pipeline 18, and flux-control and supply a gaseous oxidant. Also, an opening/closing valve 32a and a flux controller 32b such as the mass flow controller are disposed even in the purge gas pipeline 32, and flux-control and supply purge gas.

A Zr source pressure transfer pipeline 20a is inserted into the Zr source storage vessel 20, and by supplying pressure transfer gas such as He gas from the Zr source pressure transfer pipeline 20a, a liquid Zr source is fed to the Zr source pipeline 21. A flux controller 21a such as a liquid mass flow controller is disposed in the Zr source pipeline 21, and a valve 23a is disposed in the Zr source gas pipeline 23.

A Ti source pressure transfer pipeline 25a is inserted into the Ti source storage vessel 25, and by supplying pressure transfer gas such as He gas from the Ti source pressure transfer pipeline 25a, liquid Ti gas is fed to the Ti source pipeline 26. A flux controller 26a such as the liquid mass flow controller is disposed in the Ti source pipeline 26, and a valve 28a is disposed in the Ti source gas pipeline 28.

As shown in FIG. 2, the oxidant dispersion nozzle 19 for dispersing and discharging oxidants is disposed inside a concave portion 1a of the processing vessel 1. The Zr source gas dispersion nozzle 24 and the Ti source gas dispersion nozzle 29 are disposed with the oxidant dispersion nozzle 19 therebetween.

An exhaust pipe 37 for vacuum-exhausting the inside of the processing vessel 1 is provided on the reverse of the oxidant dispersion nozzle 19, Zr source gas dispersion nozzle 24, and Ti source gas dispersion nozzle 29 of the processing vessel 1. The exhaust pipe 37 is formed to be thin and long by shaving the side wall of the processing vessel in an upward and downward direction. An exhaust cover member 38, which is molded to cover the exhaust pipe 37 and have a reverse C-shaped sectional surface, is disposed through welding at a portion which corresponds to the exhaust pipe 37 of the processing vessel 1. The exhaust cover member 38 is extended upwardly along the side wall of the processing vessel 1, and defines a gas outlet 39 at an upper portion of the processing vessel 1. The processing vessel 1 is vacuumed through the gas outlet 39 by a vacuum exhaust instrument which includes a vacuum pump. A tub-shaped heating apparatus 40, which heats the processing vessel 1 and the wafer W therein, is disposed to surround an outer circumference of the processing vessel 1.

The elements of the film forming apparatus 100 are controlled by a controller 50 that is configured with a microprocessor, such as a computer. For example, the controller 50 controls the supply/shutoff of each gas by the opening/closing of the opening/closing valves 18a, 23a, 28a and 32a, the control of the flux of gas or liquid sources by the flux controllers 18b, 21a, 26a and 32b, the reversing of gas introduced into the processing vessel 1, the control of the heating apparatus 40, etc. The controller 50 is connected to a user interface 51, which includes a keyboard that enables an operator to input a command for managing the film forming apparatus 100, and a display that visualizes and displays the operating state of the film forming apparatus 100.

Moreover, the controller 50 is connected to a storage part 52, which stores control programs executed by the controller 50 for the various processing of the film forming apparatus 100 or programs for executing the processing of each element of the film forming apparatus 100 according to a processing condition, namely, the storage part 52 stores one or more recipes. The recipes are stored in a storage medium of the storage part 52. The storage medium may be a fixedly installed medium such as a hard disk, or a portable medium such as a CDROM, a DVD, or a flash memory. Also, the recipe may be appropriately transferred from another device through a dedicated line.

Furthermore, depending on the case, the controller 50 reads an arbitrary recipe from the storage part 52 and executes the recipe according to a command that is inputted through the user interface 51. Therefore, a desired processing is performed in the film forming apparatus 100 according to the control of the controller 50. That is, the storage medium of the storage part 52 stores a program (i.e., a processing recipe) for executing the below-described film forming method, and the program is executed by the controller 50 and controls the film forming apparatus 100 so as to execute the below-described film forming method according to an embodiment of the present disclosure.

<Film Forming Method According to an Embodiment of the Present Disclosure>

The following description will be made on a film forming method according to an embodiment of the present disclosure that is performed by the film forming apparatus having the above-described elements.

First, at a room temperature, for example, the wafer boat 5 with the 50 to 100 wafers W mounted thereon is lifted from under the processing vessel 1 that has been previously controlled at a certain temperature and thus loaded into the processing vessel 1. The internal space of the processing vessel 1 then becomes a sealed space by closing the lower end opening portion of the manifold 3 with the cover part 9. Subsequently, the internal pressure of the processing vessel 1 is maintained at a certain process pressure by applying vacuum thereinto. Simultaneously, the internal temperature of the processing vessel 1 is maintained at a process temperature by controlling power supplied to the heating apparatus 40 and increasing a wafer temperature, whereupon an operation of forming a film is started when the wafer boat 5 is rotating.

Figure 3:
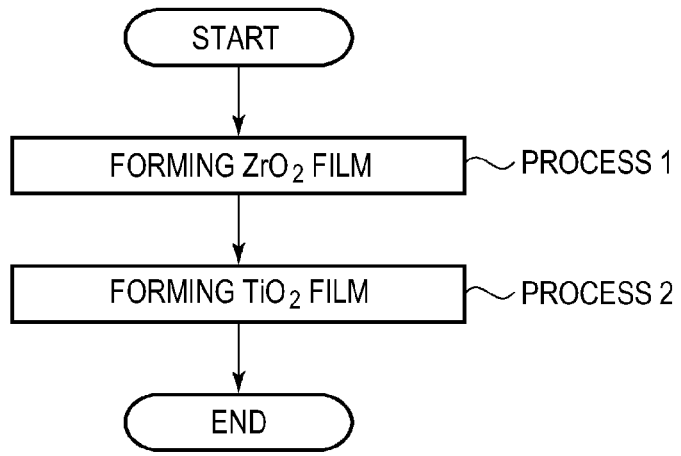
FIG. 3 is a flowchart illustrating a film forming method according to an embodiment of the present disclosure.

The film forming method of the present embodiment, as illustrated in a flowchart of FIG. 3, includes a zirconium oxide film forming process (process 1) and a titanium oxide film forming process (process 2).

<1. Zirconium Oxide Film Forming Process (Process 1)>

In a process 1 of forming the zirconium oxide film, a film forming operation is performed using an oxidant and Zr source gas of a Zr compound that includes a cyclopentadienyl ring in a structure. Specifically, as illustrated in a timing chart of FIG. 4, in the process 1, a one-time $ZrO_2$ film forming operation includes step S1 that supplies the Zr source gas to the processing vessel 1 to adsorb the Zr source gas to the wafer W, step S2 that purges the inside of the processing vessel 1 with purge gas, step S3 that oxidizes the Zr source gas by supplying $O_3$ gas as a gaseous oxidant to the processing vessel 1, and step S4 that purges the inside of the processing vessel 1 with purge gas. In the process 1, a $ZrO_2$ film having a certain thickness is formed by the ALD process that repeats the $ZrO_2$ film forming operation several times. When applying the $ZrO_2$ film as a dielectric film of a DRAM capacitor, the $ZrO_2$ film has a thickness of about 0.1 nm to about 10 nm. The more suitable thickness of $ZrO_2$ film is about 1 nm to about 8 nm.

Subsequently, depending on the case, a zirconia-based crystallized film is formed by performing annealing. In this case, an annealing temperature may be 600 degrees C. or lower. When the annealing temperature exceeds 600 degrees C., an undesirable influence may be exerted on a device.

In step S1, a Zr compound including a cyclopentadienyl ring in the structure is supplied as a Zr source from the Zr source storage vessel 20 of the Zr source gas supply instrument 15, and the vaporizer 22 vaporizes the Zr compound to generate the Zr source gas, which is supplied from the gas discharge holes 24a into the processing vessel 1 through the Zr source gas pipeline 23 and the Zr source gas dispersion nozzle 24 for a duration T1. Therefore, the Zr source gas is adsorbed onto the wafer W.

As described above, CPDTMZ and MCPDTMZ may be used as the Zr compounds for the Zr sources including a cyclopentadienyl ring in a structure, and structural formulas thereof are expressed as follows:

[Formula 1]

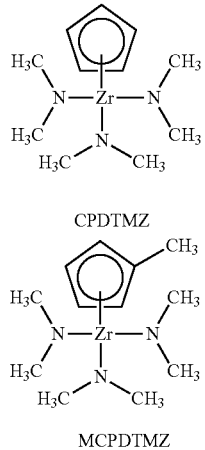

CPDTMZ

MCPDTMZ

The duration T1 of step S1 is exemplified as about 0.1 sec to about 1800 sec. Also, the flux of the Zr source may be about 0.01 ml/min(ccm) to about 10 ml/min(ccm). In this case, a pressure inside the processing vessel 1 may be about 0.3 Pa to about 66650 Pa.

In step S3 of supplying the oxidant, for example, $O_3$ gas is supplied as the oxidant from the oxidant supply source 17 of the oxidant supply instrument 14 through the oxidant pipeline 18 and the oxidant dispersion nozzle 19. Therefore, the Zr source adsorbed to the wafer W is oxidized, thereby forming the $ZrO_2$ film.

A duration T3 of step S3 may be about 0.1 sec to about 1800 sec. The flux of the oxidant varies according to the number of mounted wafers W or the kind of oxidant. However, when the $O_3$ gas is used as the oxidant and the number of mounted wafers W is 50 to 100, the flux of the oxidant may be about 1 $g/Nm^3$ to about 500 $g/Nm^3$. In this case, a pressure inside the processing vessel 1 may be about 0.3 Pa to about 66650 Pa.

Steps S2 and S4 are performed for removing gas that is left inside the processing vessel 1 after step S1 or step S3. Steps S2 and S4 further causes a reaction necessary for a subsequent process, and purge the inside of the processing vessel 1 by supplying the purge gas (for example, $N_2$) from the purge gas supply source 31 of the purge gas supply instrument 30 into the processing vessel 1 through the purge gas pipeline 32 and the purge gas nozzle 33. In this case, applying vacuum and the supply of the purge gas are repeated several times, thereby increasing the removal efficiency of the left gas. A duration T2 of step S2 and a duration T4 of step S4 may be about 0.1 sec to about 1800 sec. In this case, a pressure inside the processing vessel 1 may be about 0.3 Pa to about 66650 Pa.

Since the dischargeability of gas in step S2 differs from that in step S4, a time for applying vacuum and a time for supplying the purge gas may be changed therebetween. For example, since it takes relatively more time to discharge gas after step S1, a longer time may be set in step S2 that is performed after step S1.

<2. Titanium Oxide Film Forming Process (Process 2)>

In a process 2 of forming the titanium oxide film, a film forming operation is performed after the process 1 by using an oxidant and Ti source gas of a Ti compound that includes a cyclopentadienyl ring in a structure. Specifically, as illustrated in a timing chart of FIG. 5, in the process 2, a one-time TiO$_2$ film forming operation includes step S11 that supplies the Ti source gas to the processing vessel 1 to adsorb the Ti source gas onto a ZrO$_2$ film, step S12 that purges the inside of the processing vessel 1 with purge gas, step S13 that oxidizes the Ti source gas by supplying O$_3$ gas as a gaseous oxidant to the processing vessel 1, and step S14 that purges the inside of the processing vessel 1 with purge gas. In the process 2, a TiO$_2$ film having a certain thickness is formed by the ALD process that repeats the TiO$_2$ film forming operation several times.

In step S11, a Ti compound including a cyclopentadienyl ring in a structure is supplied as a Ti source from the Ti source storage vessel 25 of the Ti source gas supply instrument 16, and the vaporizer 27 vaporizes the Ti compound to generate the Ti source gas, which is supplied from the gas discharge holes 29a into the processing vessel 1 through the Ti source gas pipeline 28 and the Ti source gas dispersion nozzle 29 for a duration T11. Therefore, the Ti source gas is adsorbed onto the ZrO$_2$ film.

As described above, MCPDTMT may be the Ti compound including a cyclopentadienyl ring in a structure, and a structural formula thereof is expressed as follows:

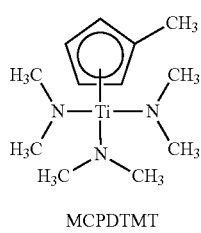

[Formula 2]

MCPDTMT

The duration T11 of step S11 may be about 0.1 sec to about 1800 sec. Also, the flux of the Ti source may be about 0.01 ml/min(ccm) to about 10 ml/min(ccm). In this case, a pressure inside the processing vessel 1 may be about 0.3 Pa to about 66650 Pa.

Step S13 of supplying the oxidant and purge steps S12 and S14 are respectively performed similarly to step S3 of supplying the oxidant in forming the ZrO$_2$ film and purge steps S2 and S4. A duration T13 of step 13, a duration T12 of step S12, and a duration T14 of step S14 are approximately identical to the duration T3, the duration T2, and the duration T4, respectively.

<Mechanism and Effect of a Film Forming Method According to an Embodiment of the Present Embodiment>

Figure 6:
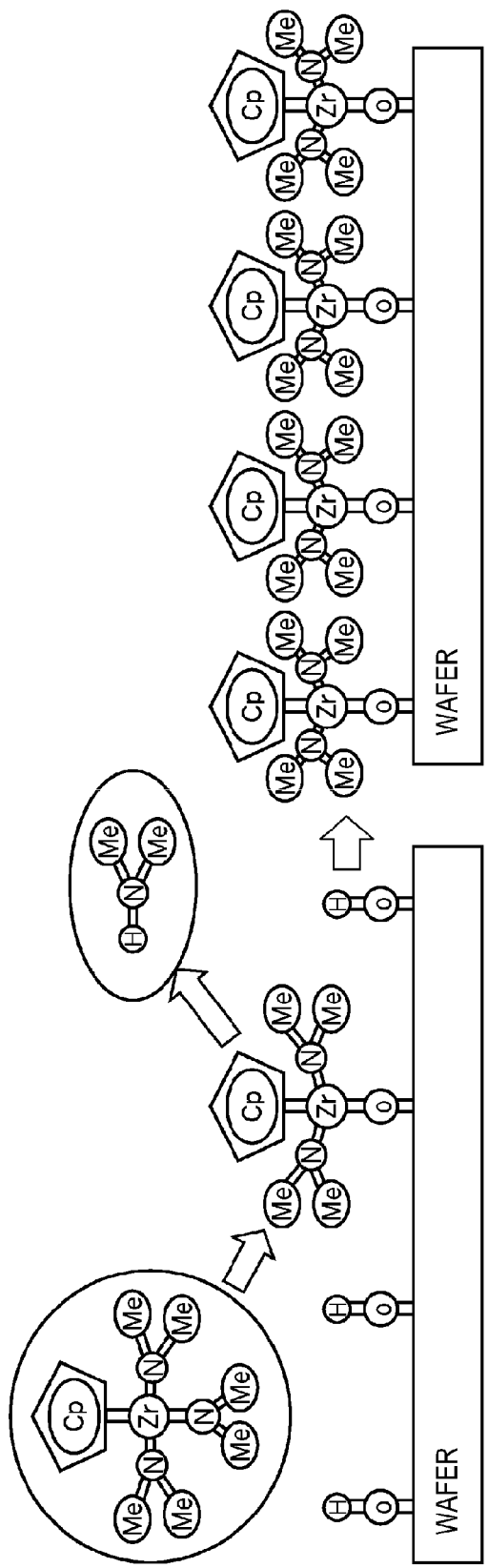
FIG. 6 is a schematic view for describing the molecular state of a Zr compound when forming a $ZrO_2$ film with a Zr compound which includes a cyclopentadienyl ring in a structure according to an embodiment of the present disclosure.

In the present embodiment, in molecules of the Zr compound, which is used as the Zr source for forming the ZrO$_2$ film and includes a cyclopentadienyl ring in a structure, as expressed in the structural formula, the cyclopentadienyl ring included in the structure becomes steric hindrance. As a result, it is difficult for the cyclopentadienyl ring side of each of the molecules to become an adsorption site to the wafer W. Therefore, as schematically illustrated in FIG. 6, in the molecules of the Zr compound that includes the cyclopentadienyl ring in the structure, a side opposite to the cyclopentadienyl ring becomes the adsorption site, and a regular adsorption arrangement is possible, where adsorbed Zr source molecules becomes one layer or less by irradiating the Zr source molecules once. Subsequently, in an oxidizing process, the one layer or less Zr source molecules adsorbed to a surface are oxidized, and Zr source molecules are adsorbed onto the Zr source molecules, and a dense film is obtained. The dense film includes lower impurities and smaller defects than a case of oxidizing a multi-layer precursor.

Such a regular arrangement is not obtained when the existing tetrakis ethylmethylamino zirconium (TEMAZ) or the like is used as the Zr source. Moreover, since pyrolysis is performed in the adsorption process, it is difficult to obtain a dense film that includes lower impurities and smaller defects as the dense film according to the present disclosure.

Actually, TEMAZ that is a non-Cp-based compound has been compared with CPDTMZ that is the Zr compound (being a Cp-based Zr compound) including a cyclopentadienyl ring in a structure.

Figure 7A:
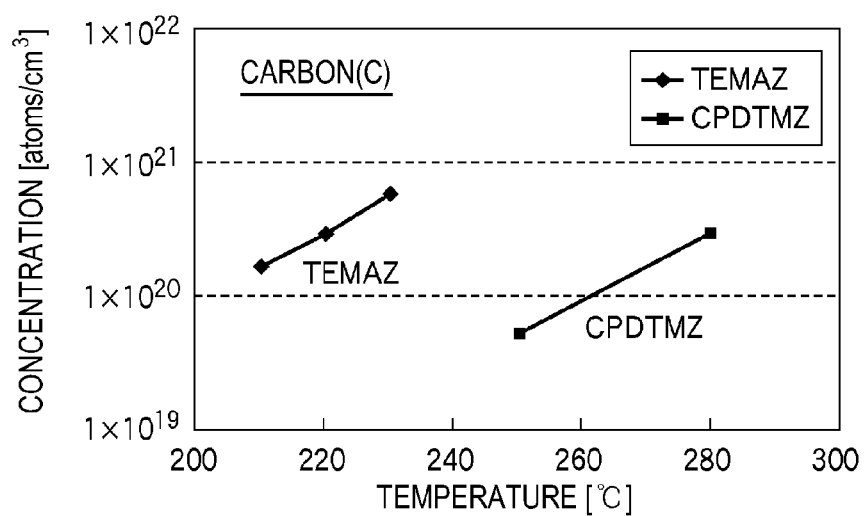
FIGS. 7A to 7C are views illustrating the impurity concentrations of $ZrO_2$ films which have been formed by respectively using CPDTMZ (being a Cp-based Zr compound) and TEMAZ (being a non-Cp-based Zr compound) as Zr sources according to an embodiment of the present disclosure.
Figure 7B:
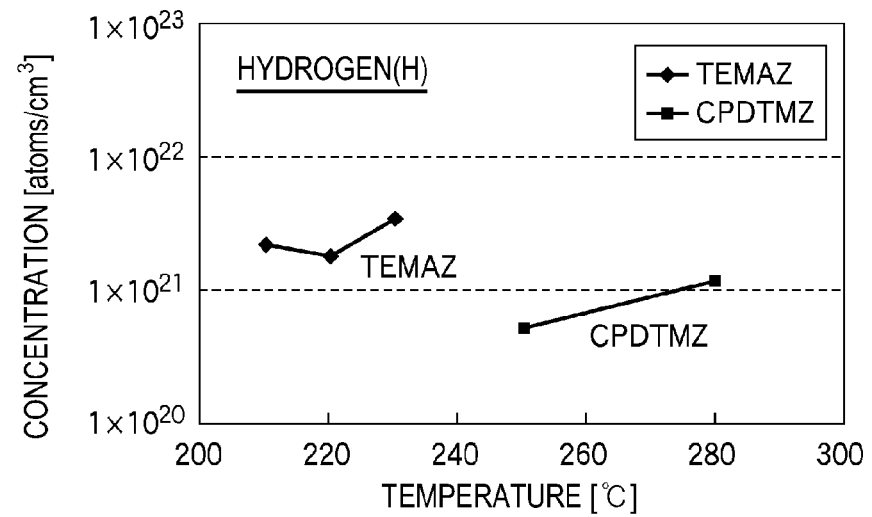
Figure 7C:
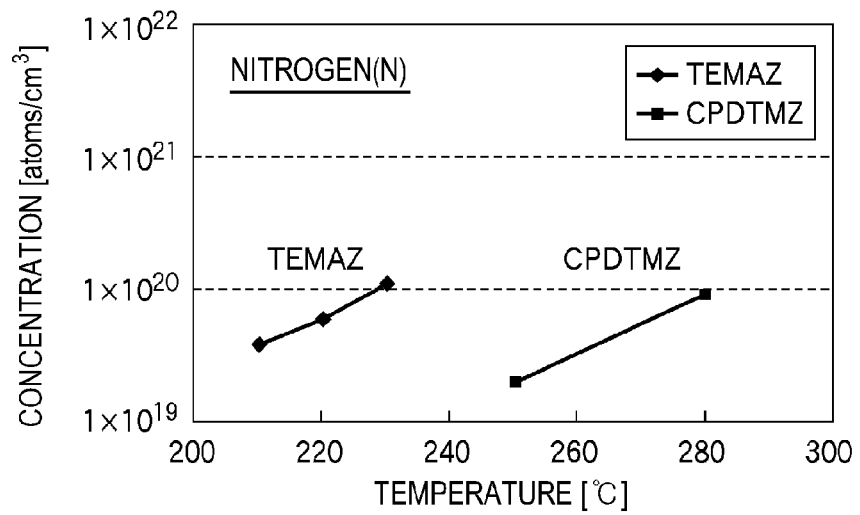

FIGS. 7A to 7C illustrate an impurity concentration measured when the ZrO$_2$ film has been formed, by using CPDTMZ (being a Cp-based Zr compound) and TEMAZ (being a non-Cp-based compound) as the Zr source. FIGS. 7A to 7C are views illustrating a carbon concentration, hydrogen concentration, and nitrogen concentration of each of the films.

As shown in FIGS. 7A to 7C, a regular adsorption arrangement can be formed in CPDTMZ that is a Cp-based Zr compound, and a film having an impurity concentration lower than TEMAZ (being a non-Cp-based compound) is formed.

Figure 8:
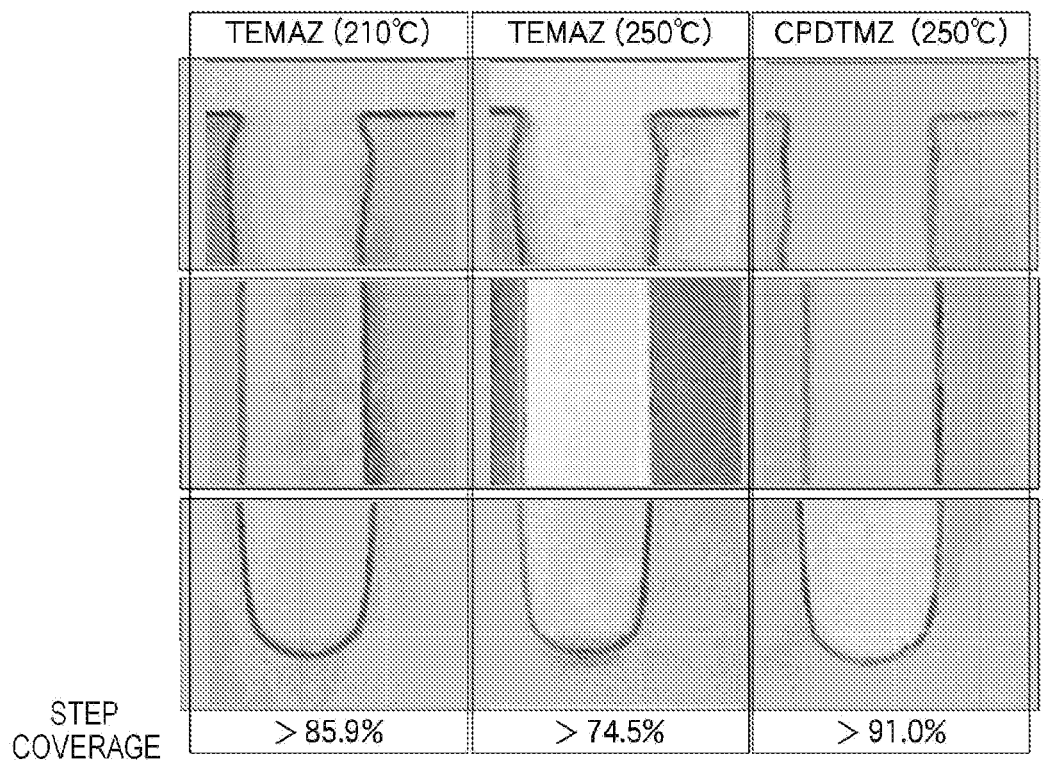
FIG. 8 is a Scanning Electron Microscope (SEM) photograph showing the step coverage of each of $ZrO_2$ films which have been formed in an internal deep trench chip by respectively using CPDTMZ and TEMAZ according to an embodiment of the present disclosure.

Next, when ZrO$_2$ films are formed in an internal deep trench chip by respectively using CPDTMZ (being a Cp-based Zr compound) and TEMAZ (being a non-Cp-based compound), the step coverage of each of the ZrO$_2$ films has been inspected by using CPDTMZ and TEMAZ. FIG. 8 is a Scanning Electron Microscope (SEM) photograph for inspecting the step coverage of each of the ZrO$_2$ films which are formed in the internal deep trench chip by respectively using CPDTMZ and TEMAZ.

As shown in FIG. 8, a regular adsorption arrangement can be formed in CPDTMZ that is a Cp-based Zr compound, and thus, it has been confirmed that a film having a step coverage better than TEMAZ (being a non-Cp-based compound) can be formed.

Figure 9:
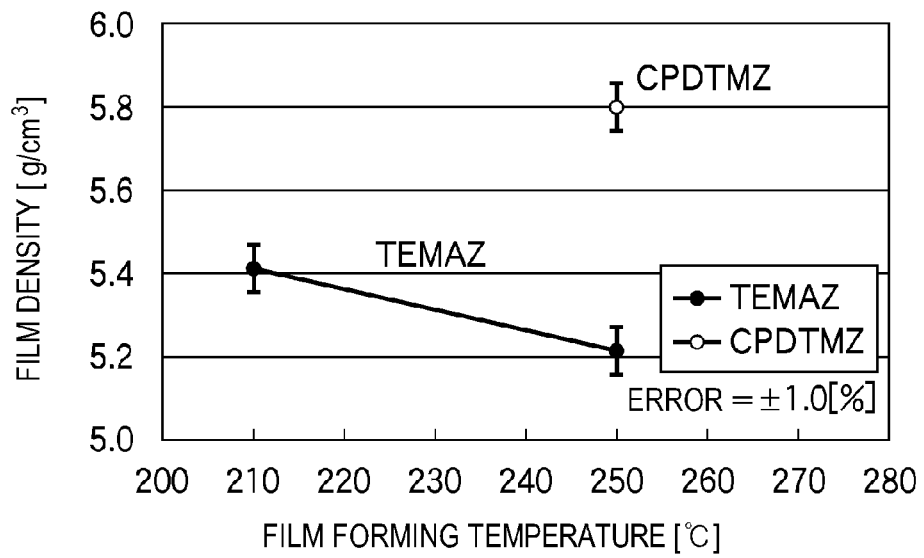
FIG. 9 is a view illustrating a result which has been obtained by comparing the density of a $ZrO_2$ film (which is formed using TEMAZ as the Zr source) with the density of a $ZrO_2$ film which is formed using CPDTMZ as the Zr source according to an embodiment of the present disclosure.

Next, FIG. 9 illustrates a comparison of the density of a film which is formed of TEMAZ (being a non-Cp-based compound) and the density of a film which is formed of CPDTMZ (being a Cp-based Zr compound). Also, the densities of the films have been measured with an X-ray reflectometry (XRR).

A ZrO$_2$ film is formed by changing a TEMAZ temperature, and has the highest density at about 210 degrees C. However, it can be seen that a ZrO$_2$ film (which is formed at about 250 degrees C. by using CPDTMZ as a Zr source) has a density higher than that of a ZrO$_2$ film which is formed of TEMAZ to have the highest density at about 210 degrees C. That is, a regular adsorption arrangement can be formed in CPDTMZ that is a Cp-based Zr compound, and thus, a film denser than TEMAZ (being a non-Cp-based compound) is formed when using CPDTMZ.

Figure 10:
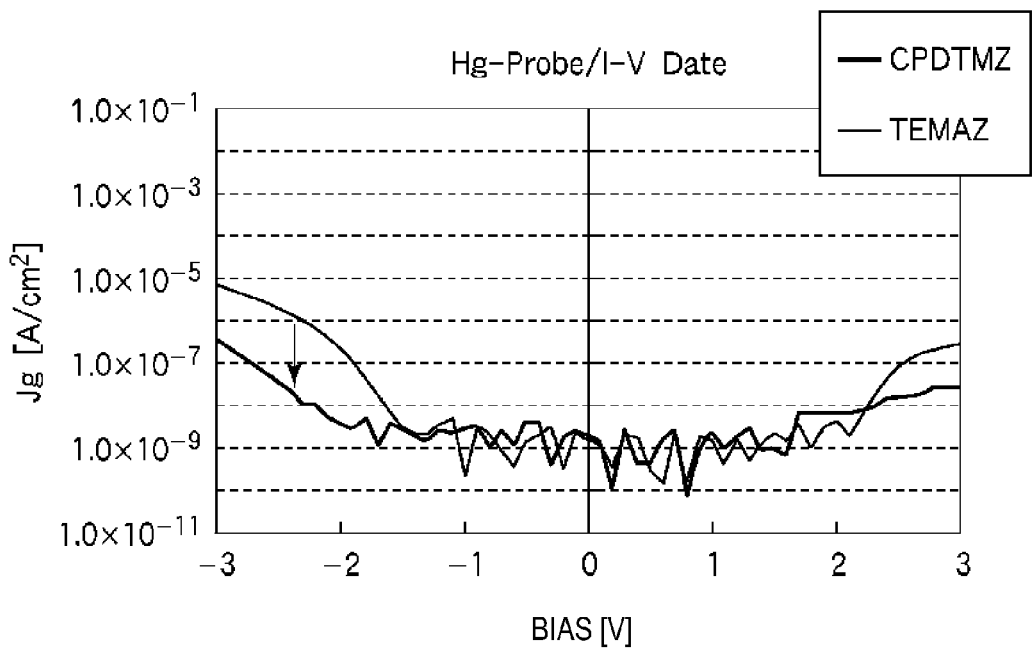
FIG. 10 is a view illustrating leakage characteristics in Hg probes of films which have been formed by respectively using CPDTMZ and TEMAZ according to an embodiment of the present disclosure.
Figure 11:
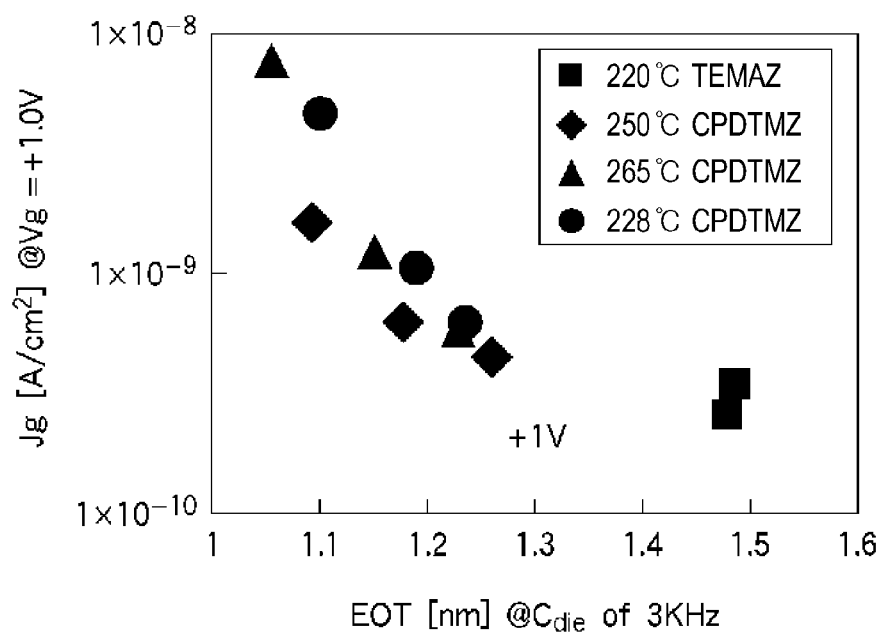
FIG. 11 is a view illustrating a relationship between an Equivalent Oxide Thickness (EOT) and a leakage current of each of films which have been formed by respectively using CPDTMZ and TEMAZ according to an embodiment of the present disclosure.

FIGS. 10 and 11 illustrates a comparison of the leakage characteristic of a film which is formed of CPDTMZ (being a Cp-based Zr compound) and the leakage characteristic of a film which is formed of TEMAZ which is a non-Cp-based compound. FIG. 10 shows leakage characteristics in Hg probes. FIG. 11 shows a relationship between an Equivalent Oxide Thickness (EOT, a $SiO_2$ capacity conversion film thickness) and a leakage current.

In comparing $ZrO_2$ single films in respective Hg probes, as shown in FIG. 10, the leakage characteristic of a film using CPDTMZ is better than that of a film using TEMAZ. Moreover, as shown in FIG. 11, the leakage resistance of a film using CPDTMZ is equal to than that of a film using TEMAZ although the EOT of the film using CPDTMZ is less than that of the film using TEMAZ. That is, a regular adsorption arrangement can be formed in CPDTMZ that is a Cp-based Zr compound, and thus, a dense film having a lower impurity concentration is formed for CPDTMZ because CPDTMZ has excellent step coverage performance. Further, consequently, a better result is obtained than a case of using TEMAZ even in an electric result.

However, unlike a non-Cp-based Zr compound, as described above, a Cp-based Zr compound enables a regular arrangement according to steric hindrance due to a cyclopentadienyl ring structure, and thus, a dense film having excellent coverage performance and relatively low impurities is formed. However, a $ZrO_2$ film which is formed using a Cp-based Zr compound as a film forming material has the loss of oxygen due to a heat load or slight impurities that degrade the characteristic of carbon or hydrogen. That is, a sufficient density is not obtained, and the $ZrO_2$ film cannot have sufficient relative permittivity and leakage current characteristic as a dielectric film of a capacitor.

To solve such limitations, the $ZrO_2$ film is formed according to an embodiment of the present disclosure. In addition, a $TiO_2$ film is then continuously formed of a Ti compound that includes a cyclopentadienyl ring in a structure to further increase the density of the $ZrO_2$ film.

It is possible to further dense the $ZrO_2$ film according the present disclosure because in the $TiO_2$ film, formed of a Ti compound that includes a cyclopentadienyl ring in a structure, Ti is easily diffused by the feature of an as depo film structure, and a step of continuously forming the $TiO_2$ film on the $ZrO_2$ film diffuses Ti from the $TiO_2$ film into the $ZrO_2$ film when a heat load for forming an upper electrode is applied onto the $TiO_2$ film, substitutes Ti (having an ion radius less than that of Zr) for impurities in the $ZrO_2$ film.

The above-mentioned features will now be described in detail.

Figure 12:
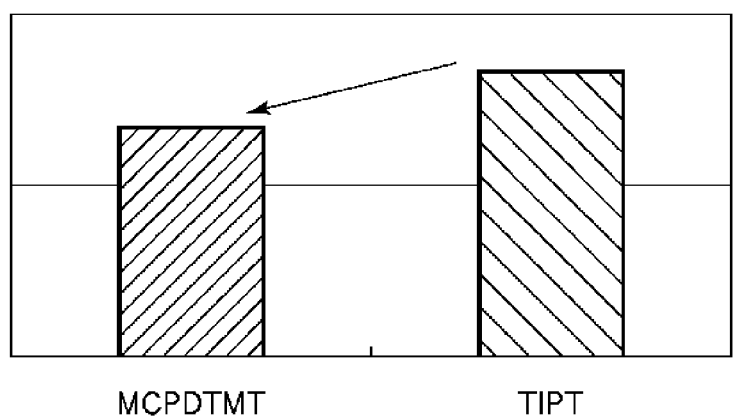
FIG. 12 is a view illustrating the impurity concentration of each of $TiO_2$ films of ZrAlO films which are formed by respectively using MCPDTMT and TIPT as a Ti source according to an embodiment of the present disclosure.
Figure 13:
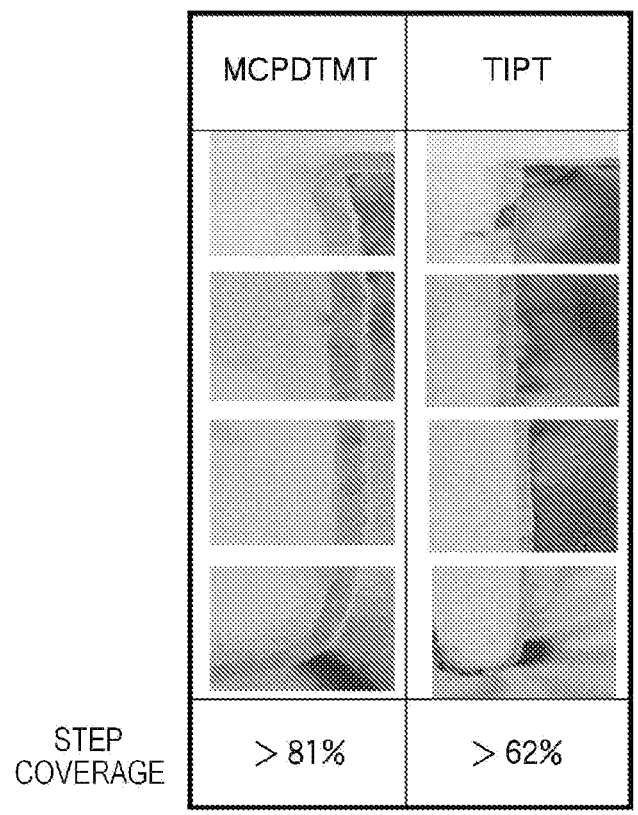
FIG. 13 is an SEM photograph for inspecting the step coverage of each of $TiO_2$ films which are formed by respectively using MCPDTMT and TIPT as the Ti source according to an embodiment of the present disclosure.

First, as a Ti source, MCPDTMT that is a Cp-based Ti compound has been compared with tetra(isopropoxy)titanium (Ti(OiPr)4 [TIPT] that is a non-Cp-based Ti compound. FIG. 12 is a view illustrating the impurity concentration of each of $TiO_2$ films which are formed by respectively using MCPDTMT and TIPT as the Ti source. FIG. 13 is an SEM photograph for inspecting the step coverage of each of the $TiO_2$ films which are formed by using MCPDTMT and TIPT as the Ti source.

As shown in FIGS. 12 and 13, a film using MCPDTMT (being a Cp-based Ti compound) has lower impurities and better step coverage performance than a film using TIPT (being a non-Cp-based Ti compound). That is, similarly to a Cp-based Zr compound, a Cp-based Ti compound also has a cyclopentadienyl ring structure, and enables a regular adsorption arrangement. Moreover, a Cp-based Ti compound has excellent coverage performance, which enables the formation of a dense film having a low impurity concentration.

Figure 14:
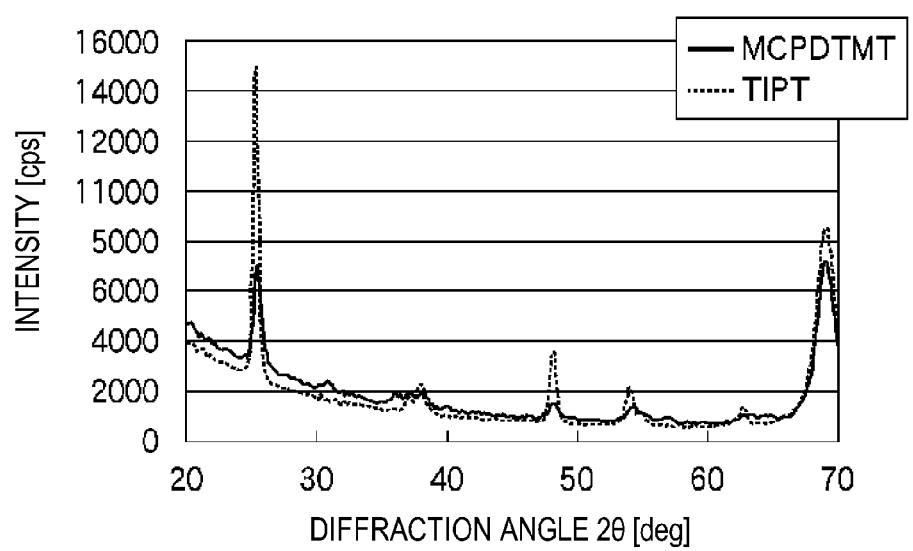
FIG. 14 is a view illustrating X-ray diffraction profiles in an as depo state, for a $TiO_2$ film which is formed using MCPDTMT as the Ti source and a $TiO_2$ film which is formed using TIPT as the Ti source according to an embodiment of the present disclosure.

FIG. 14 is a view illustrating X-ray diffraction profiles in an as depo state, for the $TiO_2$ film which is formed using MCPDTMT as the Ti source and for the $TiO_2$ film which is formed using TIPT (being a non-Cp-based Ti compound) as the Ti source. As seen in FIG. 14, the $TiO_2$ film formed of MCPDTMT and the $TiO_2$ film formed of TIPT have a clear difference in crystallinity. As shown in FIG. 14, both the $TiO_2$ film formed of MCPDTMT and the $TiO_2$ film formed of TIPT includes $TiO_2$-anatase crystallinity, but the $TiO_2$ film formed of MCPDTMT includes amorphous portions more than the $TiO_2$ film formed of TIPT.

The less amorphous portions in the $TiO_2$ film formed of TIPT causes less frequent phase changes than the $TiO_2$ film formed of MCPDTMT. In an operation of the phase change, Ti atoms are rearranged.

Figure 15:
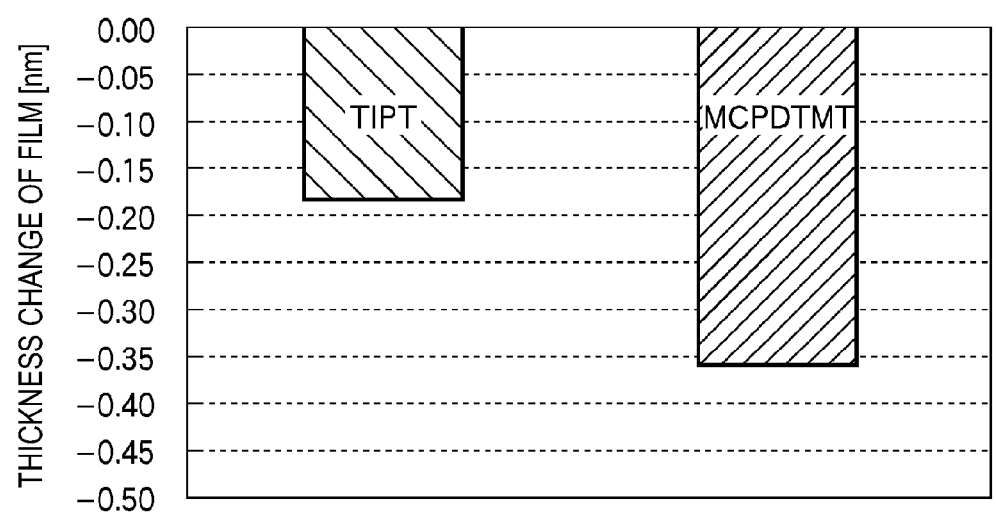
FIG. 15 is a view illustrating the thickness change (film contraction) of the $TiO_2$ film which is formed using TIPT as the Ti source and the thickness change (film contraction) of the $TiO_2$ film which is formed using MCPDTMT as the Ti source according to an embodiment of the present disclosure.

Moreover, FIG. 15 illustrates the thickness change of the $TiO_2$ film which is formed by the ALD process by using TIPT (being a non-Cp-based Ti compound) as the Ti source and the thickness change of the $TiO_2$ film which is formed by ALD by using MCPDTMT (being a Cp-based Ti compound) as the Ti source. Herein, the thickness change of each film has been inspected in a case where a film having a thickness of about 5 nm is formed on Si at a film forming temperature of about 250 degrees C. and then a heat treatment is performed at a temperature equal to or higher than a temperature applied when an upper electrode is formed on the $TiO_2$ film. As shown in FIG. 15, when the heat treatment is performed at a temperature equal to or higher than that of forming the upper electrode, a film contraction which increases heat contraction becomes easier for the $TiO_2$ film which is formed using MCPDTMT (being a Cp-based Ti compound) as the Ti source than for the $TiO_2$ film which is formed of TIPT (being a non-Cp-based Ti compound).

That is, by performing the heat treatment, a phase change from an amorphous phase becomes easier and has greater heat contraction for the $TiO_2$ film which is formed using MCPDTMT than the $TiO_2$ film which is formed of TIPT. Therefore, the rearrangement of Ti atoms is easily performed in the $TiO_2$ film which is formed of MCPDTMT, and simultaneously $TiO_2$ film may allow Ti atoms to be diffused to the $ZrO_2$ film.

As described above, a Cp-based Zr compound enables a regular arrangement according to steric hindrance due to a cyclopentadienyl ring structure, and thus, a dense $ZrO_2$ film having excellent coverage performance and relatively low impurities is formed. However, the $ZrO_2$ film may have the loss of oxygen due to the heat treatment or includes slight impurities that degrade the characteristic of carbon or hydrogen. Thus, a sufficient density may not be obtained in a single film, which may lead for the $ZrO_2$ film not to be able to sufficiently perform as a dielectric film of a capacitor.

Similarly to the $ZrO_2$ film which is formed of a Cp-based Zr compound, the $TiO_2$ film which is formed of a Cp-based Ti compound enables a regular arrangement according to steric hindrance due to a cyclopentadienyl ring structure, and thus a dense film having excellent coverage performance and relatively low impurities is formed. Also, the $TiO_2$ film which is formed of a Cp-based Ti compound causes a phase change from an amorphous phase due to the heat treatment. Further, an atomic rearrangement is performed simultaneously, whereupon film contraction occurs and Ti atoms are diffused from the $TiO_2$ film to the $ZrO_2$ film.

That is, by continuously forming the $TiO_2$ film having Ti diffusion properties with a Cp-based Ti compound on the $ZrO_2$ film which is formed using a Cp-based Zr compound as the Zr source, Ti is diffused from the $TiO_2$ film to the $ZrO_2$ film by the heat treatment in and after forming an upper electrode in and after forming the $TiO_2$ film, and Ti is replaced with impurities such as carbon or hydrogen in the $ZrO_2$ film, thus enhancing the density of the $ZrO_2$ film. As a result, a film having a small EOT and a high leakage resistance is obtained.

In this case, the $TiO_2$ film acts as a conductor when being used in combination with a TiN electrode having a small work function, and the $ZrO_2$ film with Ti diffused thereto becomes a main agent of a dielectric.

Moreover, the $TiO_2$ film has a function that densities the $ZrO_2$ film according to the diffusion of Ti, and a function that acts as a protective layer for a ZrO film.

According to the present embodiment, as described above, a $ZrO_2$ film is formed of a Zr compound which includes a cyclopentadienyl ring in a structure, and a $TiO_2$ film is subsequently formed of a Ti compound (including a cyclopentadienyl ring in a structure) on the $ZrO_2$ film, thereby forming a dense $ZrO_2$ film with low impurities. Accordingly, the relative permittivity of the $ZrO_2$ film can be increased. Further, the $TiO_2$ film not only increases the density the $ZrO_2$ film, the $TiO_2$ film acts as a protective layer, thereby decreasing a leakage current. In this way, high permittivity and a low leakage current can be all achieved, and thus, a $ZrO_2$—$TiO_2$ two-layer film that is manufactured according to the present embodiment can be applied as a dielectric film for a next generation DRAM capacitor.

<Experimental Result of the Present Disclosure>

The following description will be made on the effect based on an experiment according to an embodiment of the present disclosure.

Figure 4:
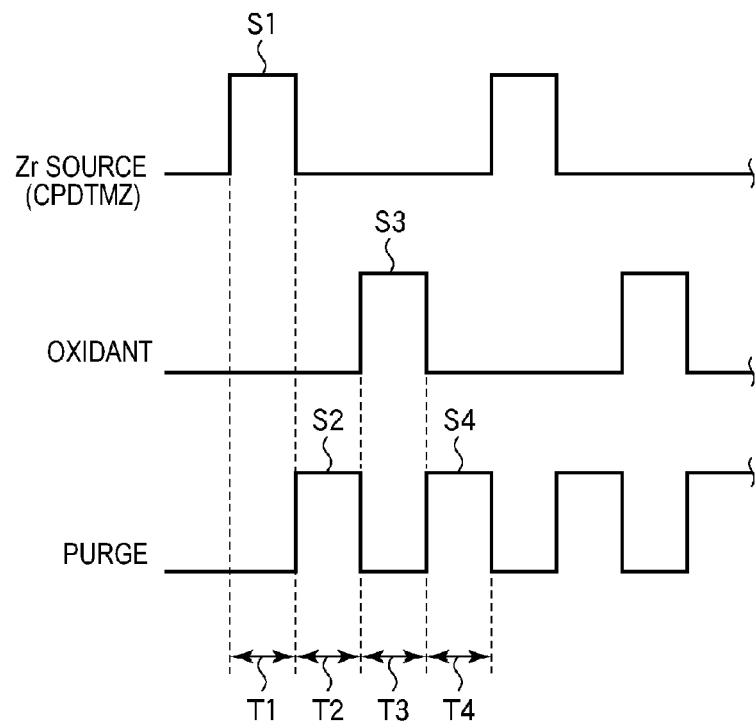
FIG. 4 is a timing chart illustrating timing for supplying gas, in forming a zirconium oxide film in the film forming method according to an embodiment of the present disclosure.
Figure 5:
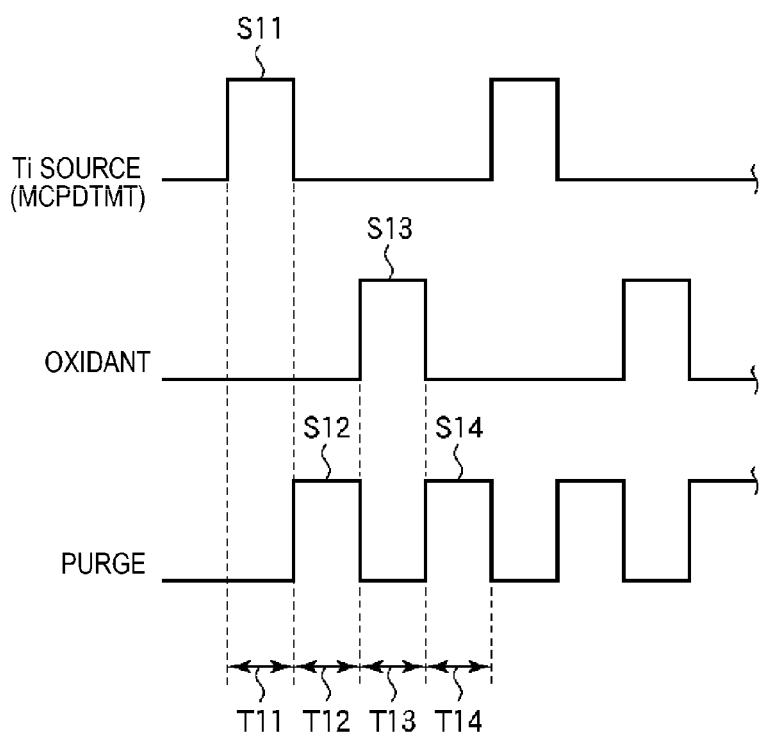
FIG. 5 is a timing chart illustrating timing for supplying gas, in forming a titanium oxide film in the film forming method according to an embodiment of the present disclosure.

Herein, by using CPDTMZ as the Zr source and using $O_3$ as an oxidant, the $ZrO_2$ film is formed on a Si substrate by the film forming apparatus of FIG. 1 to have a target film thickness of about 6 nm by the ALD process of a sequence as shown in FIG. 4. By using MCPDTMT as the Ti source and using $O_2$ as an oxidant, the $TiO_2$ film is formed on the $ZrO_2$ film by the film forming apparatus of FIG. 1 to have each of target film thicknesses of about 1 nm, about 3 nm, and about 5 nm by the ALD process of a sequence as shown in FIG. 5.

For the samples, the density and thickness of each of the $ZrO_2$ film and $TiO_2$ film have been measured with the X-ray reflectometry (XRR). The measured results are shown in Table 1. As shown in Table 1, in a two-layer film where the $TiO_2$ film is formed on the $ZrO_2$ film, the density of the $ZrO_2$ film becomes higher than that of a $ZrO_2$ single film irrespective of a thickness of the $TiO_2$ film.

TABLE 1

| Sample | | Density (g/cm$^3$) | Film thickness (nm) |
|---|---|---|---|
| —/$ZrO_2$/Si = —/6 nm | — | — | — |
|  | $ZrO_2$ | 6.12 | 5.84 |
| $TiO_2$/$ZrO_2$/Si = 1/6 nm | $TiO_2$ | 4.22 | 0.98 |
|  | $ZrO_2$ | 6.31 | 5.76 |
| $TiO_2$/$ZrO_2$/Si = 3/6 nm | $TiO_2$ | 4.20 | 3.26 |
|  | $ZrO_2$ | 6.47 | 5.82 |
| $TiO_2$/$ZrO_2$/Si = 5/6 nm | $TiO_2$ | 4.25 | 5.62 |
|  | $ZrO_2$ | 6.50 | 5.48 |

Next, a TiN film is used as a lower electrode, and similarly to the experiment, a film is formed of CPDTMZ, thereby manufacturing a reference sample for a $ZrO_2$ single film. A sample is manufactured by forming a $TiO_2$ film with MCPDTMT on the $ZrO_2$ film to have each of target film thicknesses of about 1 nm, about 3 nm, and about 5 nm.

A capacitance has been measured for each of the samples. The measured results are shown in Table 2. Table 2 shows capacitances that have been standardized by using a capacitance of 1 in the $ZrO_2$ single film. As shown in Table 2, in a sample which is manufactured by forming the $TiO_2$ film with MCPDTMT on the $ZrO_2$ film, capacitances increase to higher than those of the sample for the $ZrO_2$ single film.

TABLE 2

| | Capacitance Result Ti source: MCPDTMT | | | |
|---|---|---|---|---|
| Sample | No $TiO_2$ | $TiO_2$ = 1 nm | $TiO_2$ = 3 nm | $TiO_2$ = 5 nm |
| $C_{v=0}$ | 1 | 1.4 | 1.5 | 1.4 |

Figure 16A:
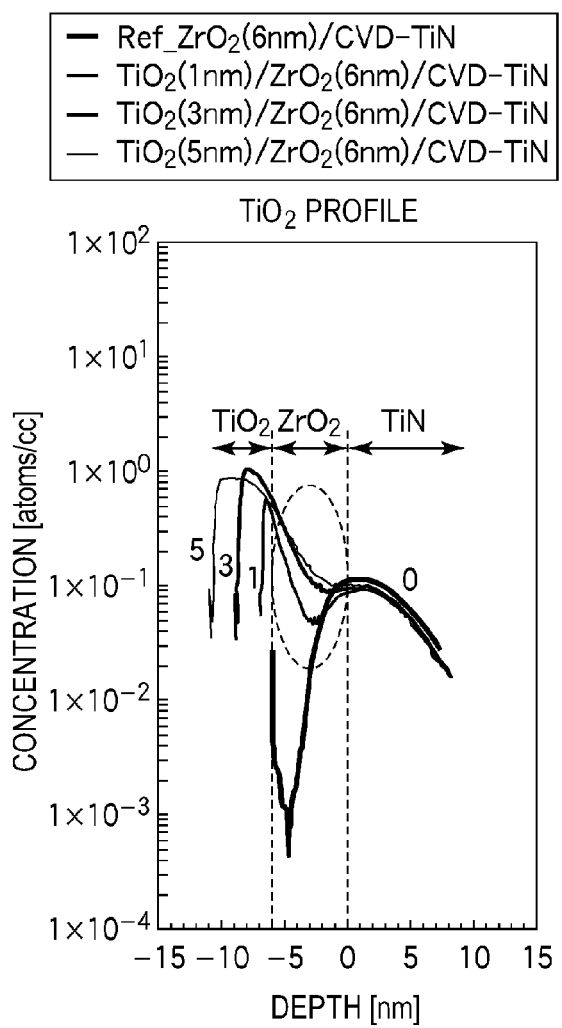
FIGS. 16A to 16C are views illustrating results which have been obtained by inspecting the distributions of $TiO_2$, H, and C in a depth direction through the secondary ion mass spectrometry, for a sample which is manufactured by forming a $ZrO_2$ film with MCPDTMT on a TiN film and a sample which is manufactured by forming a $TiO_2$ film with MCPDTMT on the $ZrO_2$ film to have each of target film thicknesses of about 1 nm, about 3 nm, and about 5 nm according to an embodiment of the present disclosure.
Figure 16B:
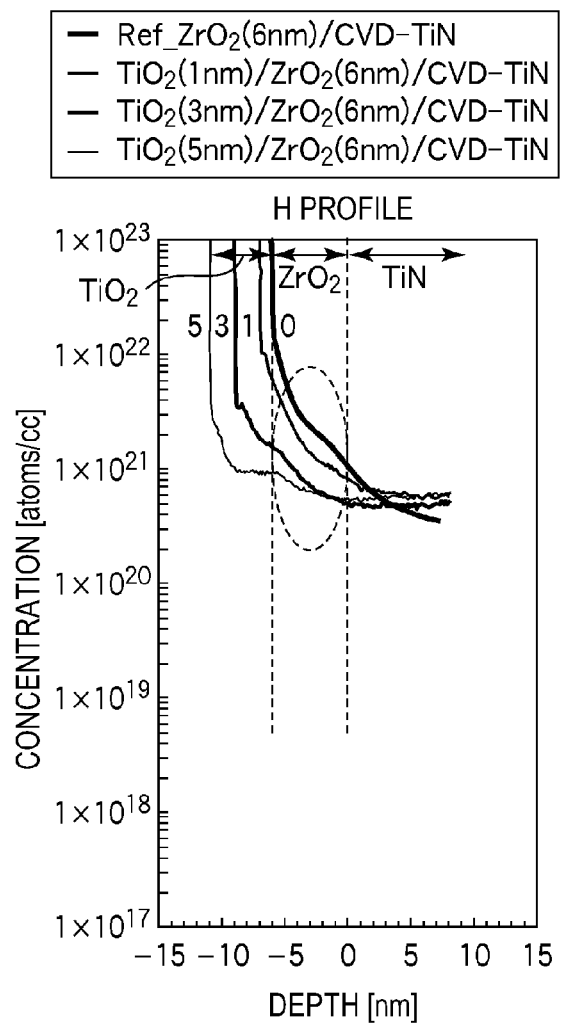
Figure 16C:
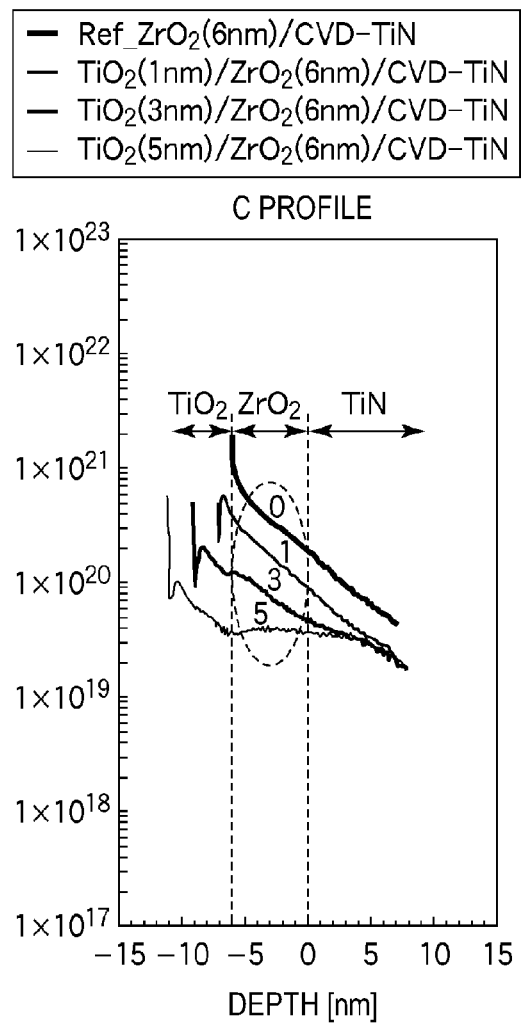

Next, the distributions of $TiO_2$, H, and C in a depth direction have been inspected by the secondary ion mass spectrometry, for a sample that is manufactured by forming a film on a TiN film. The inspected results are shown in FIGS. 16A to 16C. As shown in FIGS. 16A to 16C, in a sample which is manufactured by forming a $TiO_2$ film with MCPDTMT on a $ZrO_2$ film, the amount of $TiO_2$ in the $ZrO_2$ film is higher than the $ZrO_2$ single film, and the amounts of H and C in the $ZrO_2$ film are lower than the $ZrO_2$ single film. This result supports that by forming the $TiO_2$ film with MCPDTMT on the $ZrO_2$ film, Ti is diffused into a site where H or C has been removed from the $ZrO_2$ film, and thus, the density of the $ZrO_2$ film increases and moreover a capacitance becomes higher.

Next, likewise, samples are manufactured by forming a $TiO_2$ film on a $ZrO_2$ film to respectively have target film thicknesses of about 1 nm, about 3 nm, and about 5 nm by using TIPT (being a compound having no cyclopentadienyl ring) instead of MCPDTMT as a Ti source, and capacitances have been measured for the samples. For comparison, a capacitance has been measured for the sample of the $ZrO_2$ single film. The measured results are shown in Table 3. Similarly to Table 2, Table 3 also shows relative permittivities that have been standardized by setting the relative permittivity of the $ZrO_2$ single film to 1. As shown in Table 3, in a two-layer film that is formed by forming the $TiO_2$ film on the $ZrO_2$ film by using TIPT (being a compound having no cyclopentadienyl ring) as the Ti source, only relative permittivities approximately equal to the $ZrO_2$ single film are obtained. This is because when the $TiO_2$ film is formed using a compound (having no cyclopentadienyl ring) as the Ti source, Ti is not sufficiently diffused from the $TiO_2$ film to the $ZrO_2$ film.

TABLE 3

| | Capacitance Result Ti source: TIPT | | | |
|---|---|---|---|---|
| Sample | No $TiO_2$ | $TiO_2$ = 1 nm | $TiO_2$ = 3 nm | $TiO_2$ = 5 nm |
| $C_{v=0}$ | 1 | 1.00 | 1.01 | 0.97 |

Figure 17A:
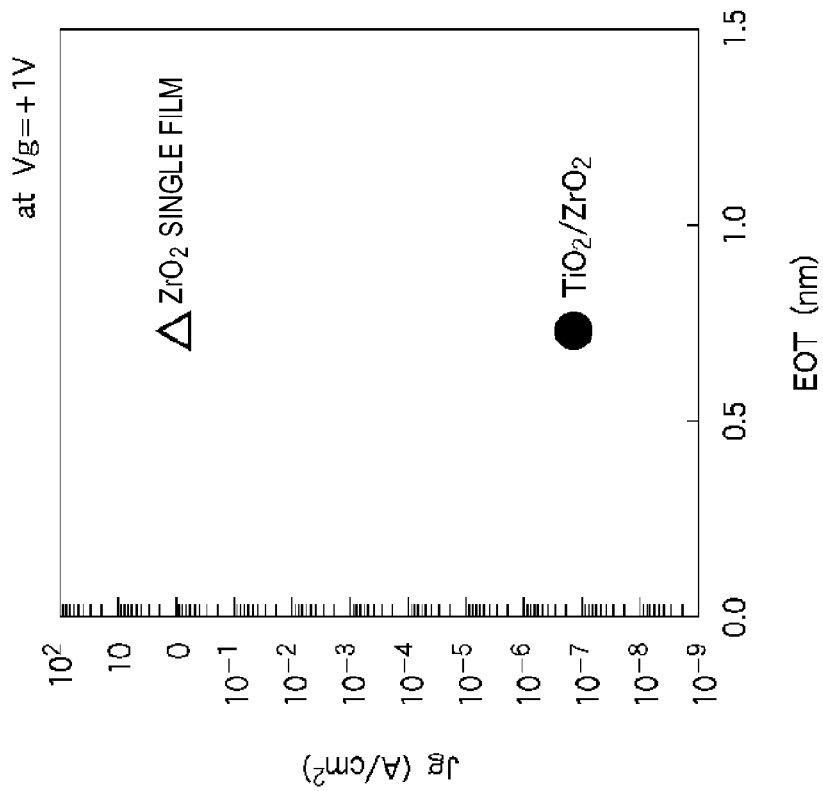
FIGS. 17A and 17B are graphs in which EOTs are given to the abscissa axis and leakage current values are given to the ordinate axis, for an MIM flat capacitor sample which uses a $ZrO_2$ single film as a dielectric film and uses a TiN film as each of an upper electrode and a lower electrode, and an MIM flat capacitor sample which uses a $ZrO_2$—$TiO_2$ two-layer film of the present disclosure as a dielectric film and uses a TiN film as each of an upper electrode and a lower electrode according to an embodiment of the present disclosure.
Figure 17B:
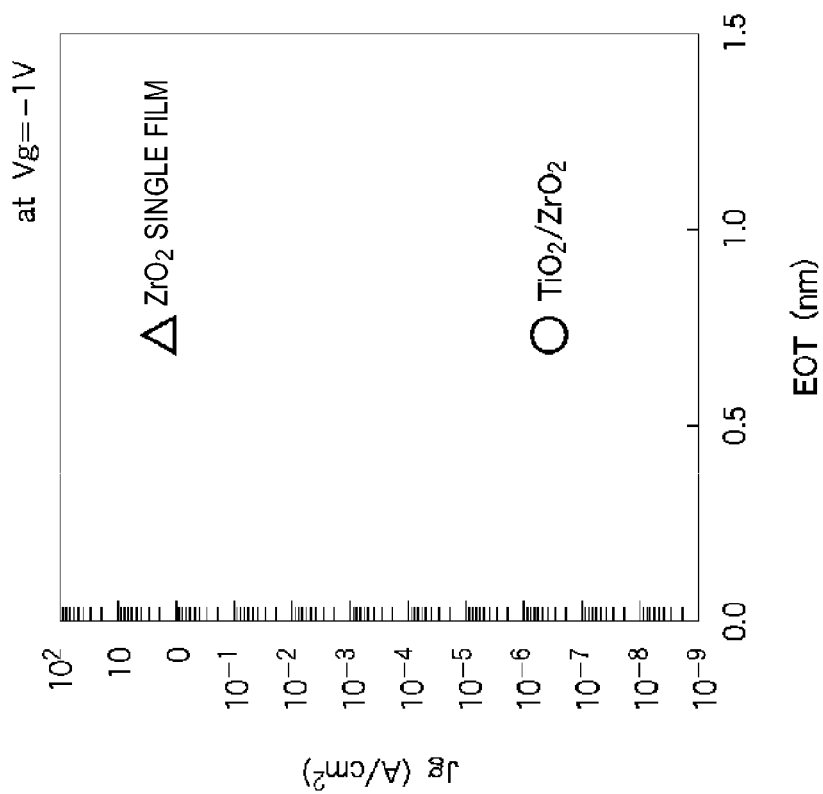

Next, leakage currents have been measured when Vg=1 V and Vg=−1 V, for an MIM flat capacitor sample where a $ZrO_2$ film is formed on a TiN film (being a lower electrode) to a thickness of about 6 nm by using CPDTMZ as a Zr source as described above and a TiN film (being an upper electrode) is formed on the $ZrO_2$ film, and for an MIM flat capacitor sample where a $ZrO_2$—$TiO_2$ two-layer film is formed by forming a $ZrO_2$ film on a TiN film (being a lower electrode) to a thickness of about 6 nm as described above and forming a $TiO_2$ film on the $ZrO_2$ film to a thickness of about 5 nm by using MCPDTMT as a Ti source, and then a TiN film (being an upper electrode) is formed on the $ZrO_2$—$TiO_2$ two-layer film. FIGS. 17A and 17B are graphs in which EOTs of the samples are given to the abscissa axis and leakage current values are given to the ordinate axis, when Vg=1 V and Vg=−1 V. As shown in FIGS. 17A and 17B, a leakage current is more reduced in the $ZrO_2$—$TiO_2$ two-layer film sample than the $ZrO_2$ single film, and the $ZrO_2$—$TiO_2$ two-layer film satisfies an EOT and a leakage current value applicable as a next generation dielectric film (capacitive insulation film).

Figure 18:
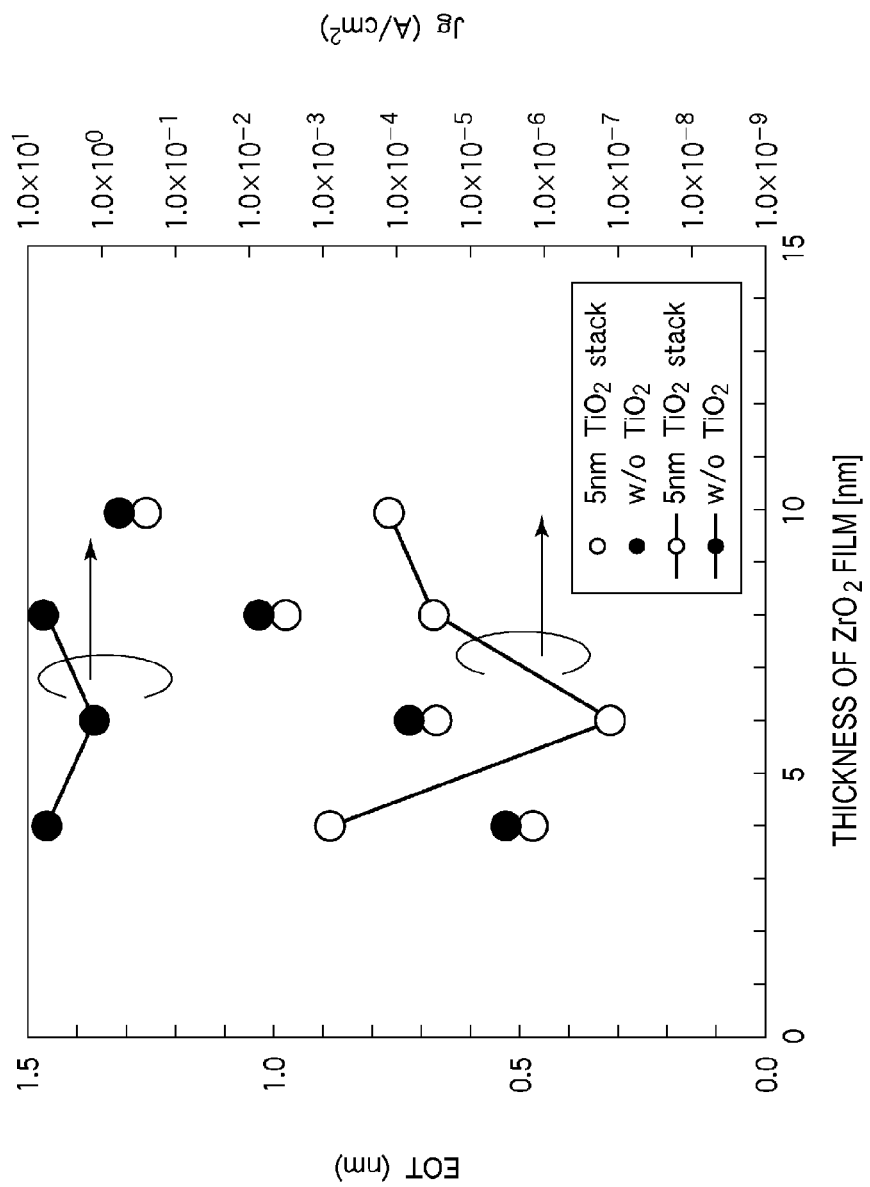
FIG. 18 is a graph in which thicknesses of a $ZrO_2$ film are given to the abscissa axis and EOTs and leakage current values are given to the ordinate axis, for the MIM flat capacitor sample which uses the $ZrO_2$ single film as the dielectric film and uses the TiN film as each of the upper electrode and lower electrode, and the MIM flat capacitor sample which uses the $ZrO_2$—$TiO_2$ two-layer film of the present disclosure as the dielectric film and uses the TiN film as each of the upper electrode and lower electrode according to an embodiment of the present disclosure.

Next, EOTs and leakage currents have been measured for a sample that is manufactured by changing the thickness of the $ZrO_2$ film in the same method and layer structure. The measured result is shown in FIG. 18. FIG. 18 is a graph showing a relationship between the thicknesses of the $ZrO_2$ film (which are given to the abscissa axis) and EOTs and leakage current values that are given to the ordinate axis. As shown in FIG. 18, a leakage current value is the lowest when the sample has the $ZrO_2$—$TiO_2$ two-layer film and the thickness of the $ZrO_2$ film is about 6 nm.

<Other Applications>

Moreover, the present disclosure is not limited to the above embodiments but may be modified variously. For example, in the above embodiments, the present disclosure has been exemplified as being applied to a batch-type film forming apparatus that mounts a plurality of wafers thereon and integratedly forms a film, but is not limited thereto. The present disclosure may be applied to a single-wafer film forming apparatus that forms a film in units of one wafer.

Moreover, in the above embodiments, although CPDTMZ and MCPDTMZ are used as a Zr compound including a cyclopentadienyl ring in a structure and MCPDTMT is used as a Ti compound that includes a cyclopentadienyl ring in a structure, the present disclosure is not limited thereto.

Moreover, in the above embodiments, the ALD process has been applied as the film forming method, but the present disclosure is not limited thereto. As another example, Chemical Vapor Deposition (CVD) may be applied as the film forming method.

Moreover, a substrate to be processed is not limited to a semiconductor wafer, and other substrates such as Liquid Crystal Display (LCD) glass substrates may also be applied as the substrate to be processed.

According to the present disclosure, the zirconium oxide film is formed on the substrate to be processed by supplying the oxidant and the zirconium material formed of the Zr compound that includes a cyclopentadienyl ring in a structure, and the titanium oxide film is formed on the zirconium oxide film by supplying the oxidant and the titanium material formed of the Ti compound that includes a cyclopentadienyl ring in a structure. Thus, the zirconium oxide film and the titanium oxide film are formed as high-density films that have low impurities and small defects, and moreover, the protection function of the titanium oxide film enables the achievement of both high permittivity and a low leakage current that are necessary for the dielectric film of the DRAM capacitor.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a dielectric film which includes a zirconium oxide film, the method comprising:

forming a zirconium oxide film on a substrate to be processed by alternately supplying a zirconium material and an oxidant into a processing vessel several times, the zirconium material including cyclopentadienyl.tris (dimethylamino)zirconium or methylcyclopentadienyl .tris(dimethylamino)zirconium, wherein a side opposite to a cyclopentadienyl ring in the zirconium material becomes an adsorption site to the substrate; and forming a titanium oxide film on the zirconium oxide film by alternately supplying a titanium material and the oxidant into the processing vessel several times, the titanium material including methylcyclopentadienyl.tris (dimethylamino)titanium, wherein a side opposite to a cyclopentadienyl ring in the titanium material becomes an adsorption site to the zirconium oxide film.

2. The method of claim 1, wherein, said alternately supplying the oxidant and the zirconium material are repeated with a process, which discharges gas from inside the processing vessel, therebetween, and said alternately supplying the oxidant and the titanium material are repeated with the process, which discharges gas from inside the processing vessel, therebetween.

3. A film forming apparatus for forming a dielectric film which includes a zirconium oxide film, the film forming apparatus comprising:

a processing vessel having a bell shape to maintain vacuum and a tube shape;

a maintaining member configured to maintain a plurality of substrates to be processed inside the processing vessel, the substrates to be processed being maintained in a plurality of stages;

a heating apparatus disposed at an outer circumference of the processing vessel;

a zirconium material supply instrument configured to supply a zirconium material into the processing vessel;

a titanium material supply instrument configured to supply a titanium material into the processing vessel;

an oxidant supply instrument configured to supply an oxidant into the processing vessel; and a control instrument configured to control the zirconium material supply instrument, the titanium material supply instrument, and the oxidant supply instrument, wherein the control instrument controls a performance of a process that forms a zirconium oxide film on a substrate to be processed among the plurality of substrates to be processed by alternately supplying the oxidant and a zirconium material into the processing vessel several times, the zirconium material including cyclopentadienyl.tris(dimethylamino)zirconium or methylcyclopentadienyl.tris(dimethylamino)zirconium, wherein a side opposite to a cyclopentadienyl ring in the zirconium material becomes an adsorption site to the substrate, and a performance of a process that forms a titanium oxide film on the zirconium oxide film by alternately supplying the oxidant a titanium material into the processing vessel several times, the titanium material including methylcyclopentadienyl.tris(dimethylamino)titanium, wherein a side opposite to a cyclopentadienyl ring in the titanium material becomes an adsorption site to the zirconium oxide film.

4. A non-transitory computer readable medium operating in a computer and storing a program for controlling a film forming apparatus, wherein when the program is executed by the computer, the program controls the film forming apparatus to perform the film forming method of claim 1.

* * * * *